(12) United States Patent
Singer et al.

(10) Patent No.: US 12,740,034 B2
(45) Date of Patent: Sep. 15, 2026

(54) PROCESSOR MODULE INSTALLATION TOOL WITH PROTECTIVE INTERLOCK FEATURE

(71) Applicant: International Business Machines Corporation, Armonk, NY (US)

(72) Inventors: Noah Singer, White Plains, NY (US); Mark D. Schultz, Ossining, NY (US); Yuet-Ying Yu, Hopewell Junction, NY (US); Scott R. LaPree, Rochester, MN (US); Jason R. Eagle, Mantorville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 782 days.

(21) Appl. No.: 18/324,833

(22) Filed: May 26, 2023

(65) Prior Publication Data

US 2024/0397686 A1 Nov. 28, 2024

(51) Int. Cl.
*H05K 13/04* (2006.01)

(52) U.S. Cl.
CPC ................................ *H05K 13/0408* (2013.01)

(58) Field of Classification Search
CPC ............... H05K 13/04; H05K 13/0406; H05K 13/0408; H05K 13/041; H05K 13/0447; H01R 43/205; H01R 43/22; B25B 27/00
See application file for complete search history.

(56) References Cited

U.S. PATENT DOCUMENTS

| | | | |
|---|---|---|---|
| 5,350,306 A | 9/1994 | Delprete | |
| 5,660,562 A | 8/1997 | Lin | |
| 5,901,263 A | 5/1999 | Gaio | |
| 6,058,014 A | 5/2000 | Choudhury | |
| 6,307,747 B1 | 10/2001 | Farnsworth | |
| 6,638,094 B1 | 10/2003 | Zhang | |
| 6,811,421 B1 | 11/2004 | Gattuso | |
| 9,476,660 B2 | 10/2016 | Potter | |
| 10,109,975 B2 * | 10/2018 | Eagle | H01R 43/22 |
| 10,537,050 B2 | 1/2020 | Elsasser | |
| 2003/0026073 A1 | 2/2003 | Mcgowan et al. | |
| 2005/0042897 A1 | 2/2005 | Zhang | |
| 2009/0111293 A1 | 4/2009 | Rubenstein et al. | |

(Continued)

FOREIGN PATENT DOCUMENTS

| | | |
|---|---|---|
| CN | 101426352 A | 5/2009 |
| CN | 114731779 A | 7/2022 |
| TW | M616304 U | 9/2021 |

OTHER PUBLICATIONS

Taiwan Patent Office, “Office Action,” Sep. 18, 2024, 4 Pages, TW Application No. 113103263.

(Continued)

*Primary Examiner* — Gilbert Y Lee
(74) *Attorney, Agent, or Firm* — Yuanmin Cai

(57) ABSTRACT

A processor placement tool that prevents removal of the processor module unless the protective cover is in place. In order to prevent engagement of the gripping devices against the processor module, piston interlocks are provided that block rotation of the gripping devices unless the protective cover is in place. The piston interlocks release their blocking when they contact the protective cover.

8 Claims, 11 Drawing Sheets

(56) References Cited

U.S. PATENT DOCUMENTS

| | | | | |
|---|---|---|---|---|
| 2012/0166113 | A1 | 6/2012 | Pettersen | |
| 2013/0263444 | A1* | 10/2013 | Lo | B25B 9/00 81/487 |
| 2022/0130734 | A1 | 4/2022 | Chiu | |
| 2022/0377952 | A1 | 11/2022 | Axelsson | |

OTHER PUBLICATIONS

Disclosed Anonymously. "Microprocessor Socket Cover Removal Tool." Nov. 24, 2010. IPCOM000201819D, https://priorart.ip.com/IPCOM/000201819.

Disclosed Anonymously. "Multi-position interlock mechanism for a microprocessor handling tool to accommodate different processor package sizes." Mar. 30, 2013. IPCOM000226362D. https://priorart.ip.com/IPCOM/000226362.

* cited by examiner

PROCESSOR MODULE INSTALLATION TOOL WITH PROTECTIVE INTERLOCK FEATURE

BACKGROUND

The present invention relates to installation and removal of processor modules, and more specifically, to a tool for installing and removing a processor module only when the protective cover is in place.

Processor removal tools are essential devices used in computer hardware maintenance and upgrades. Their primary purpose is to safely and efficiently remove processors, also known as CPUs (Central Processing Units), from their sockets on the motherboard. These tools are designed to minimize the risk of damage to the CPU, socket or motherboard during the removal process.

Processor removal tools typically consist of a mechanical device with a handle and various mechanisms to secure and release the CPU. They are specifically engineered to fit the socket type and size of the processor being removed, ensuring a secure grip and precise alignment. Some tools may have adjustable features to accommodate different CPU socket designs.

SUMMARY

According to an embodiment of the present disclosure, a processor placement tool that prevents removal of the processor module unless the protective cover is in place is disclosed. The processor placement tool includes a first gripping device and a second gripping device. The first and second gripping devices are parallel to each other and can move between a module open position and a module closed position. The first and second gripping devices further include an interlock portion. The processor placement tool includes a first elastic element that is configured to bias an actuator. Additional elastic elements are provided to interact with the first and second gripping devices. The additional elastic elements are configured to cause the first and second gripping devices to assume the module open position in the absence of an applied force on them. The actuator includes a handle, a tubular element, and hilts that extend outwardly from the tubular element. The hilts are designed to hold the first and second gripping devices in the module closed position against a bias applied to the first and second gripping devices by the additional elastic elements. The first elastic element causes the hilts to release the first and second gripping devices from the module closed position to the module open position. The processor placement tool also includes at least two piston interlocks placed such that at least one piston interlock interfaces with the interlock portion of each of the first and second gripping devices. The piston interlocks prevent movement of the first and second gripping devices from the module open position to the module closed position in the absence of a protective cover on a processor module. The piston interlock is made up of a piston housing, a piston, a pin, and a spring. The piston is disposed within the piston housing and has a foot portion the bottom of the piston. The pin is attached to the piston and extends outward from the piston and through the interlock portion. The spring is located around the piston such that the bottom portion of the spring contacts the foot of the piston, and the top portion of the spring contacts the piston housing. The springs holds the piston in a blocking position until the foot of the piston is displaced in response to contact with the protective cover of the processor module.

BRIEF DESCRIPTION OF THE DRAWINGS

FIG. 9 is a cutaway view of the processor placement tool cut at line BB in FIG. 2 with the gripping devices removed.

DETAILED DESCRIPTION

Figure 1:
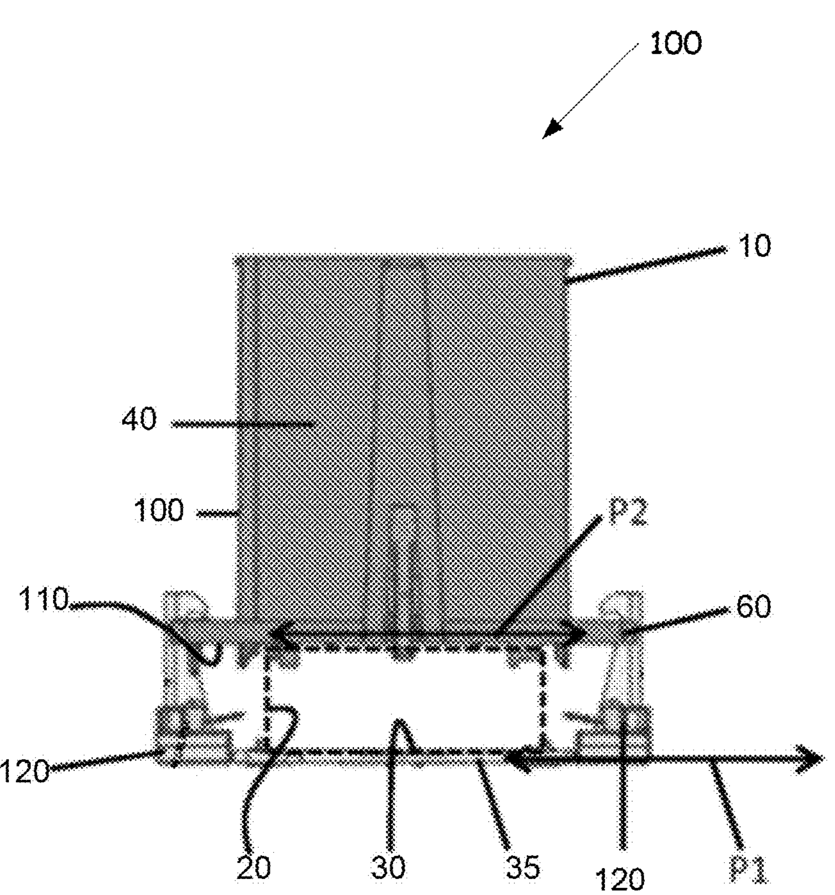
FIG. 1 is a diagrammatic illustration of a processor placement tool (processor tool) according to embodiments of the present disclosure.

Aspects of the present disclosure relate to installation and removal of processor modules, and more specifically, to a tool for installing and removing a processor module only when the protective cover is in place. While the present disclosure is not necessarily limited to such applications, various aspects of the disclosure may be appreciated through a discussion of various examples using this context.

Processor removal tools are essential devices used in computer hardware maintenance and upgrades. Their primary purpose is to safely and efficiently remove processors, also known as CPUs (Central Processing Units), from their sockets on the motherboard. These tools are designed to minimize the risk of damage to the CPU, socket or motherboard during the removal process.

Processor removal tools typically consist of a mechanical device with a handle and various mechanisms to secure and release the CPU. They are specifically engineered to fit the socket type and size of the processor being removed, ensuring a secure grip and precise alignment. Some tools may have adjustable features to accommodate different CPU socket designs.

To remove a processor using a removal tool, the user inserts the tool into the CPU socket and engages the securing mechanism. This could involve locking levers, retention arms, or other mechanisms that hold the CPU in place. Once secured, the user applies gentle force to release the CPU from the socket, disconnecting it from the motherboard.

These tools provide several advantages over manual removal methods. They help avoid potential damage caused by improper handling, such as bending or breaking socket pins or damaging delicate motherboard components. Additionally, removal tools reduce the risk of electrostatic discharge (ESD), which can be detrimental to sensitive electronic components like CPUs or the motherboard.

Different processor removal tools exist to accommodate various CPU socket types, such as Intel LGA (Land Grid Array) and AMD PGA (Pin Grid Array) sockets. It is crucial to choose a tool that matches the specific socket type of the processor being removed to ensure compatibility and safe removal.

Processors come in two different varieties. There are lidded processor modules and unlidded processor modules. Lidded processor modules have the benefit that there is minimal risk of damage to the chips or the TIM1 because the lid completely covers the top of the module. However, there is increased thermal resistance and reduced thermal performance due to the additional TIM2 interface. Unlidded processor modules have an increased risk of damage to the chips or TIM1 because they are completely exposed to debris, dropped tools, hand contact and the like. However, they provide increased thermal performance due to a single TIM interface. This increased thermal performance increases the module yield significantly. Unlidded modules, such as the modules used in IBM zSeries systems from International Business Machines Corporation, use an interlocked temporary lid to protect the module when it is not covered by a heatsink or coldplate. The temporary lid is designed to be difficult to remove from the top of the module to prevent exposures but if the module is removed from the drawer without the cover in place then the protection of the cover is not available. As such, the present disclosure addresses this problem by preventing removal of the module from the drawer unless the protective cover is in place.

Figure 2:
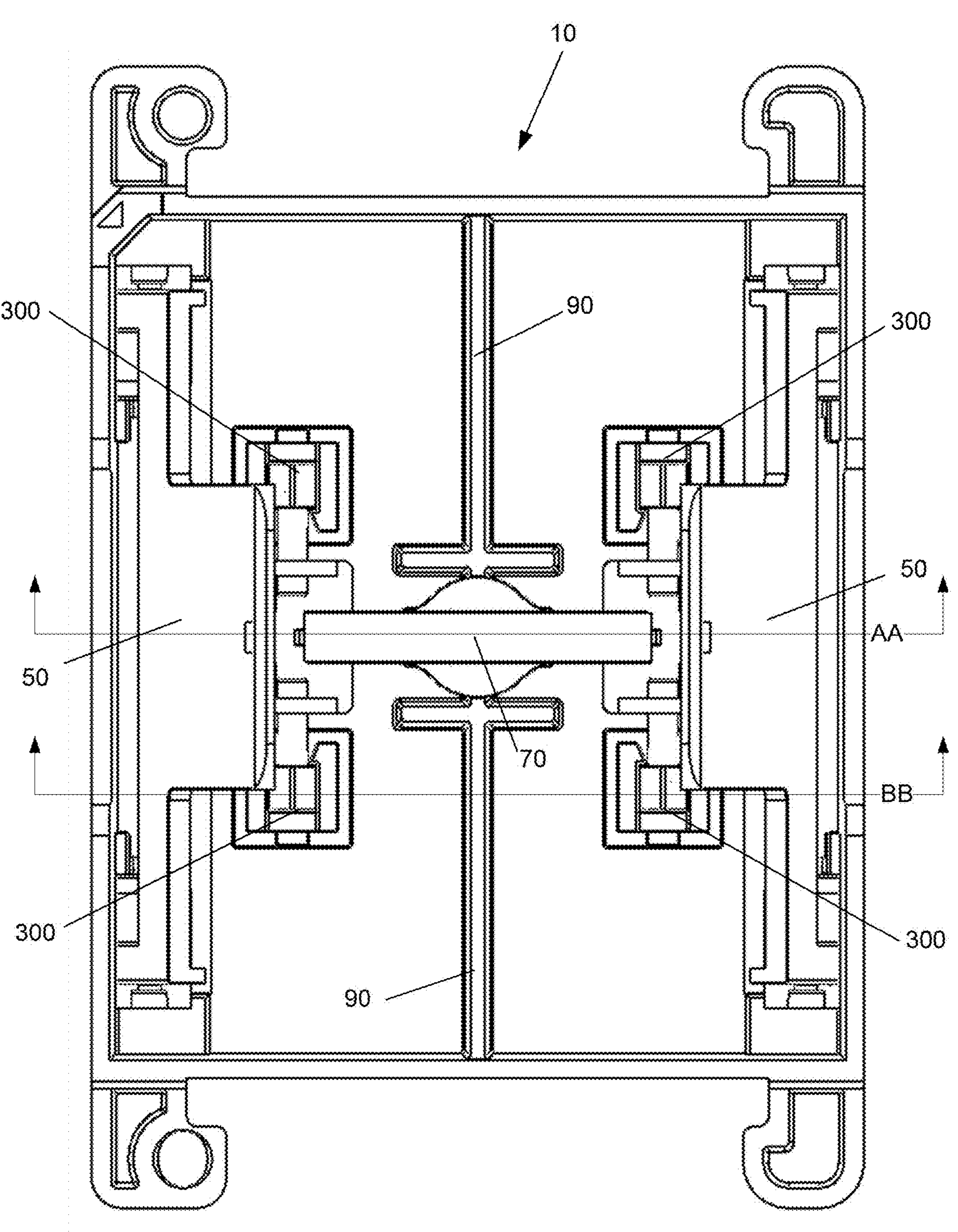
FIG. 2 is a top down view of the processor placement tool according to embodiments of the present disclosure.
Figure 3:
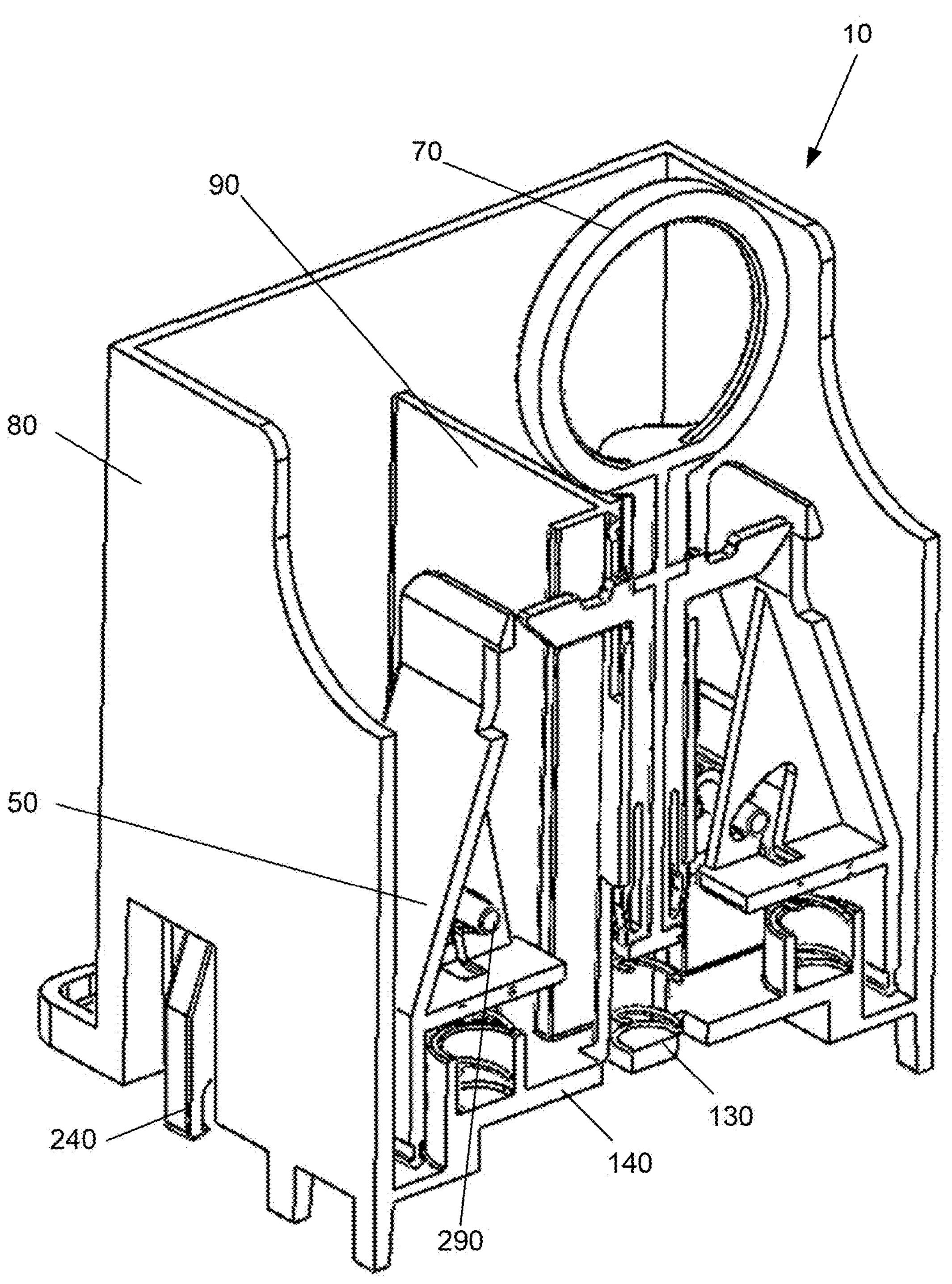
FIG. 3 is a cutaway perspective view of the processor placement tool cut at line AA in FIG. 2.
Figure 4:
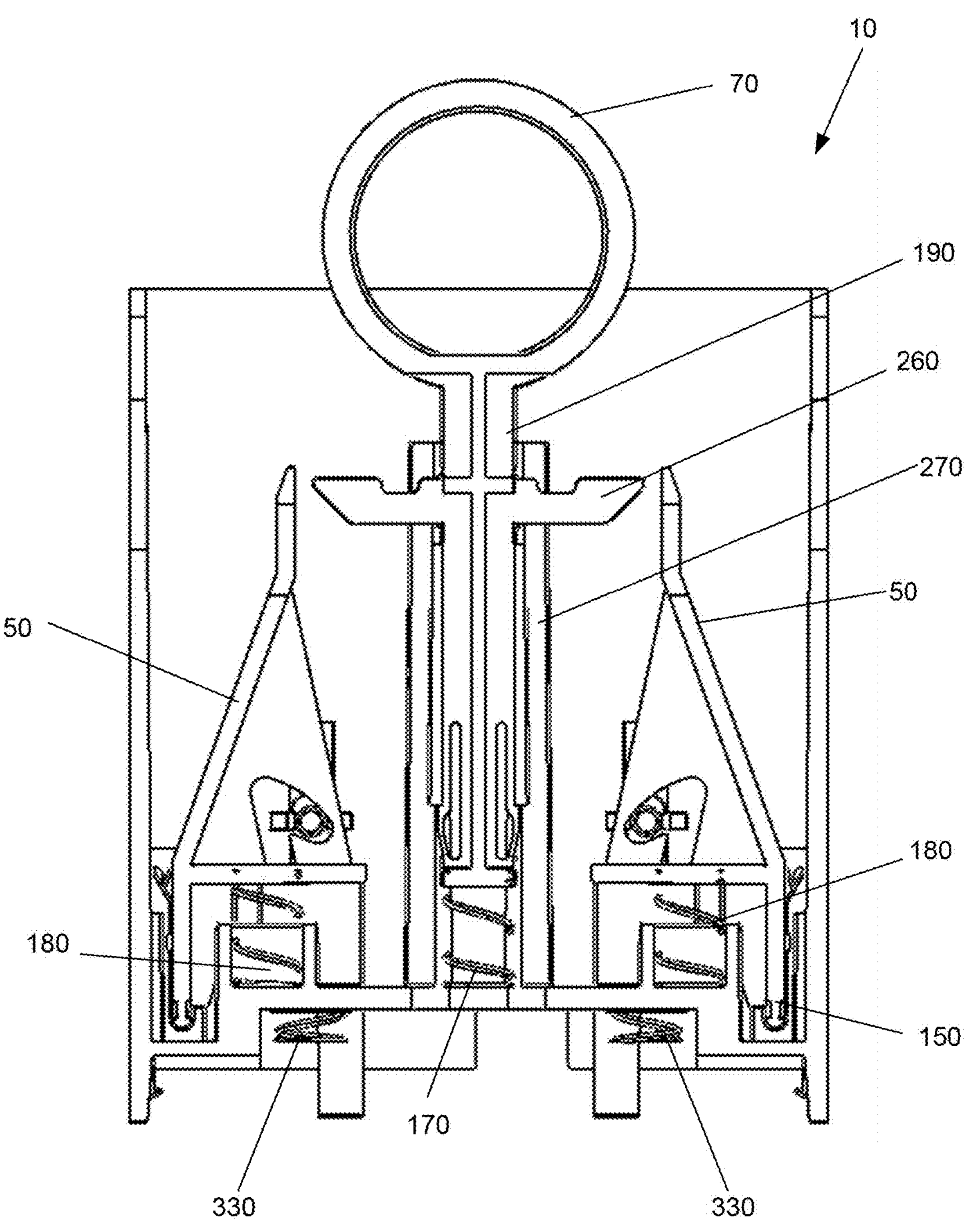
FIG. 4 is a cutaway view of the processor placement tool cut at line AA in FIG. 2.
Figure 5:
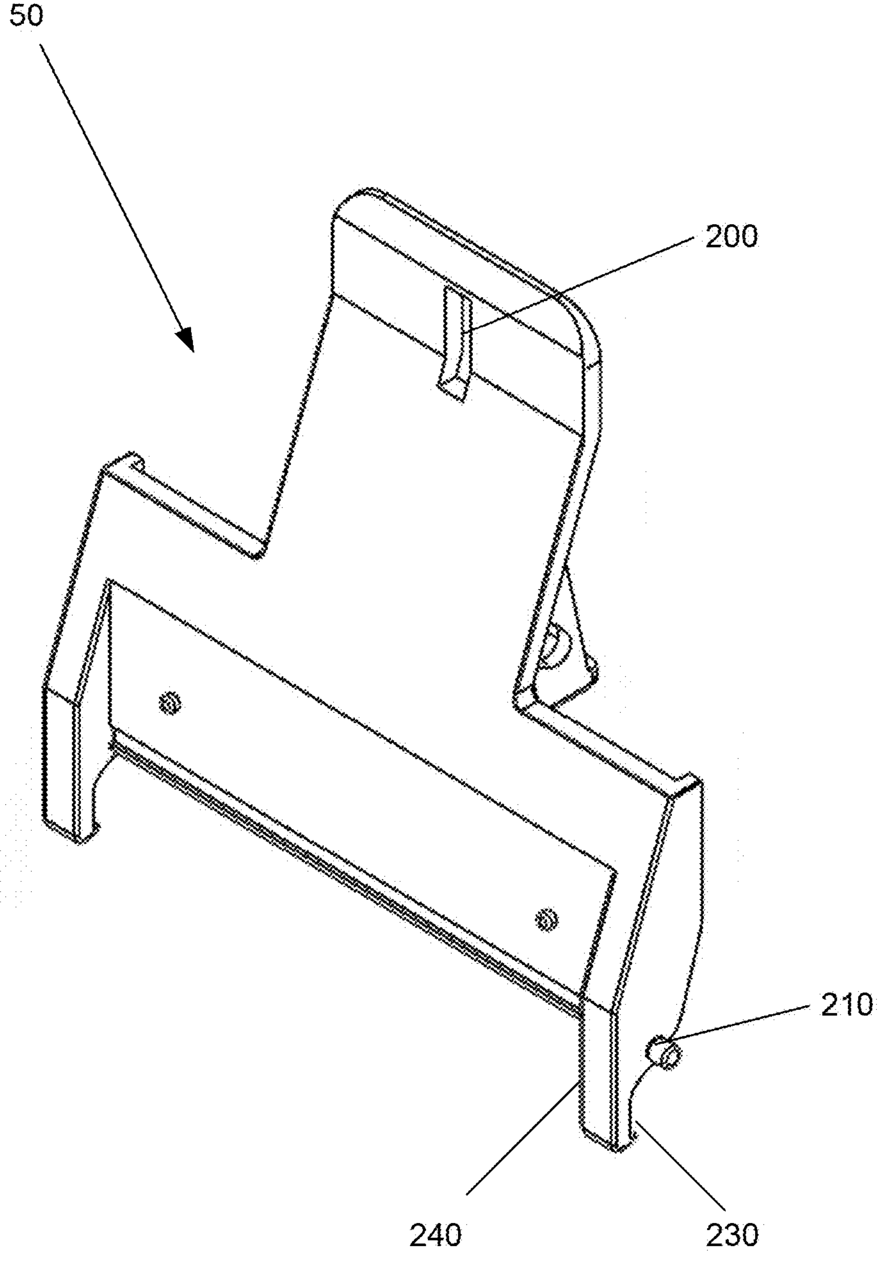
FIG. 5 is a front perspective view of a gripping device according to embodiments of the present disclosure.
Figure 6:
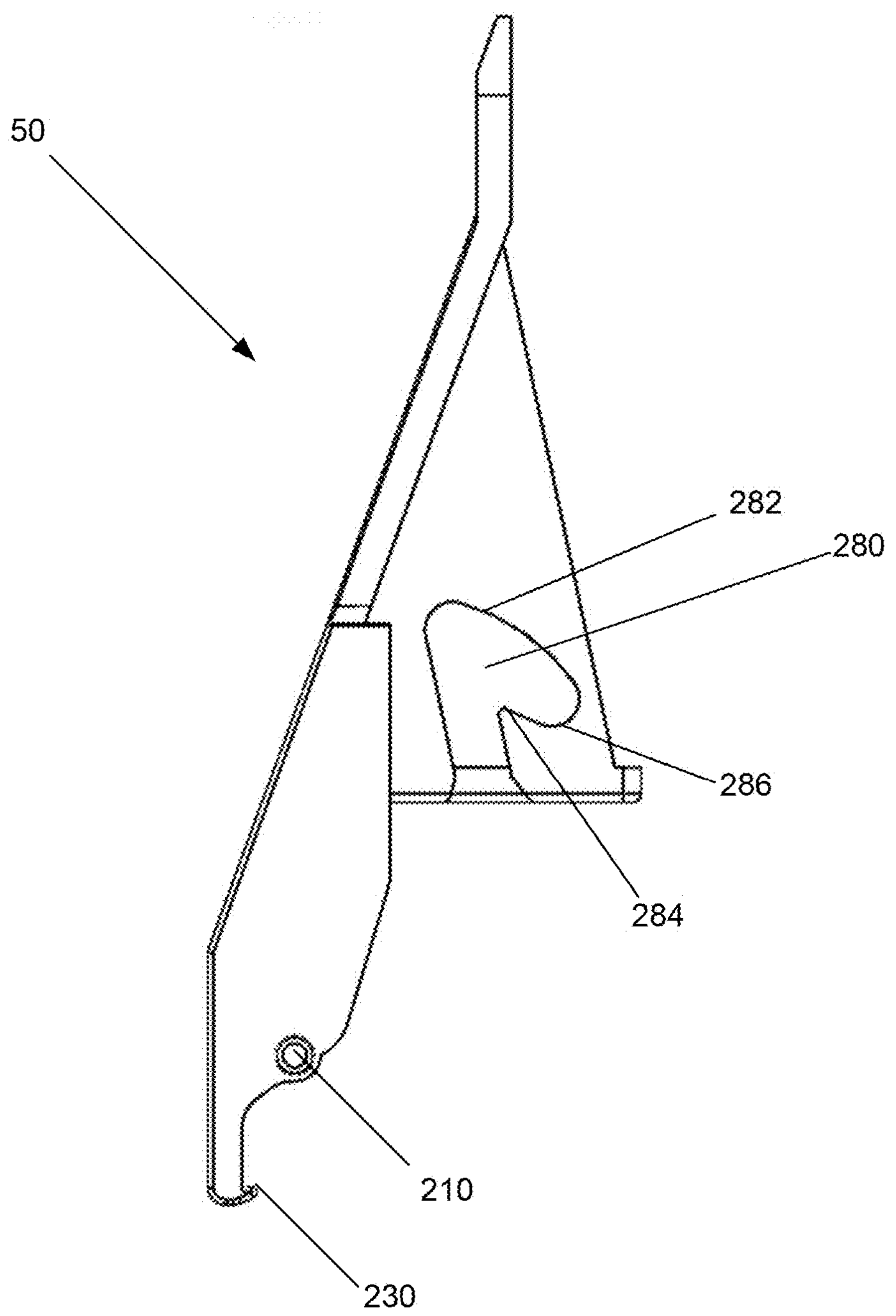
FIG. 6 is a side view of a gripping device according to embodiments of the present disclosure.
Figure 7:
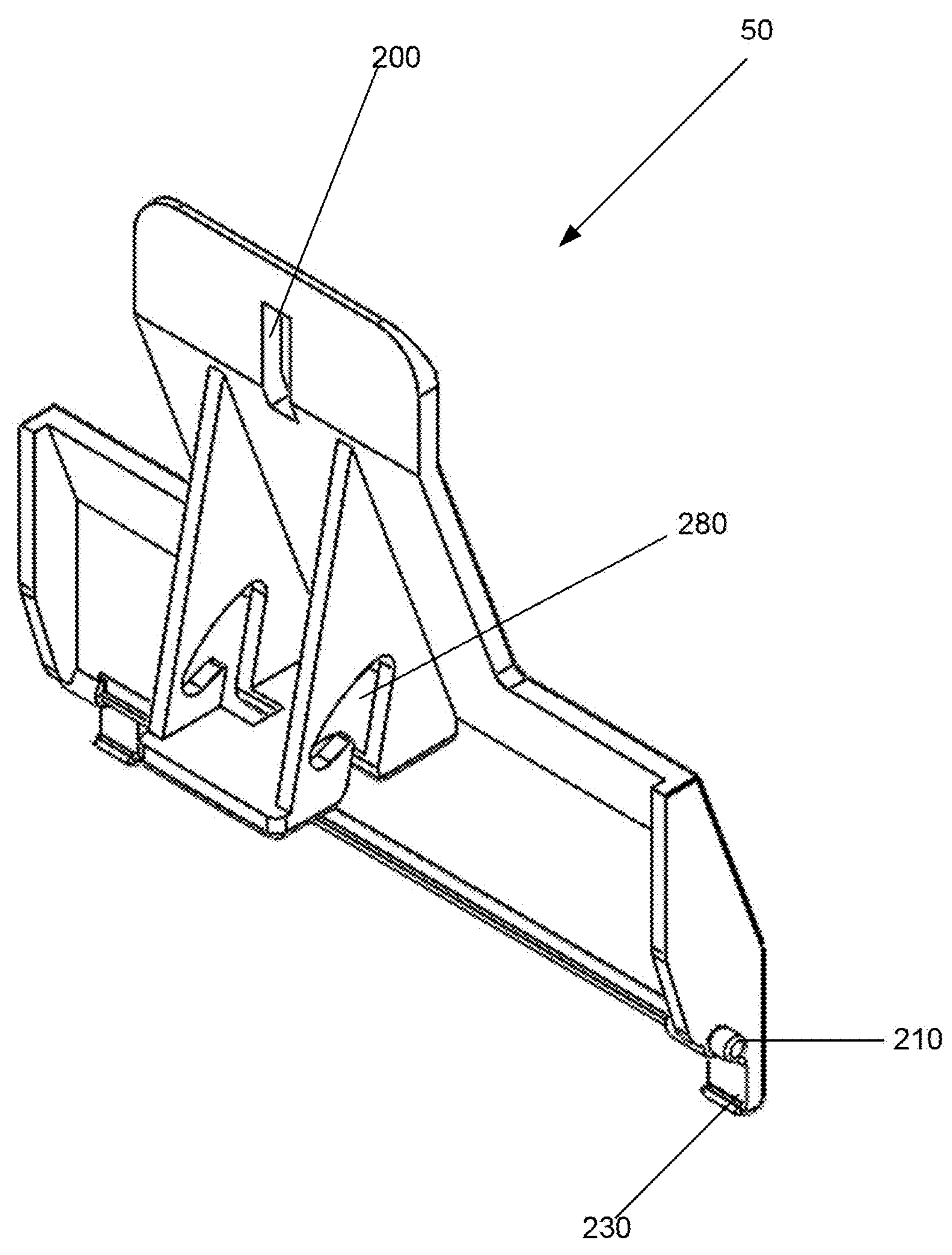
FIG. 7 is a rear perspective view of a gripping device according to embodiments of the present disclosure.
Figure 8:
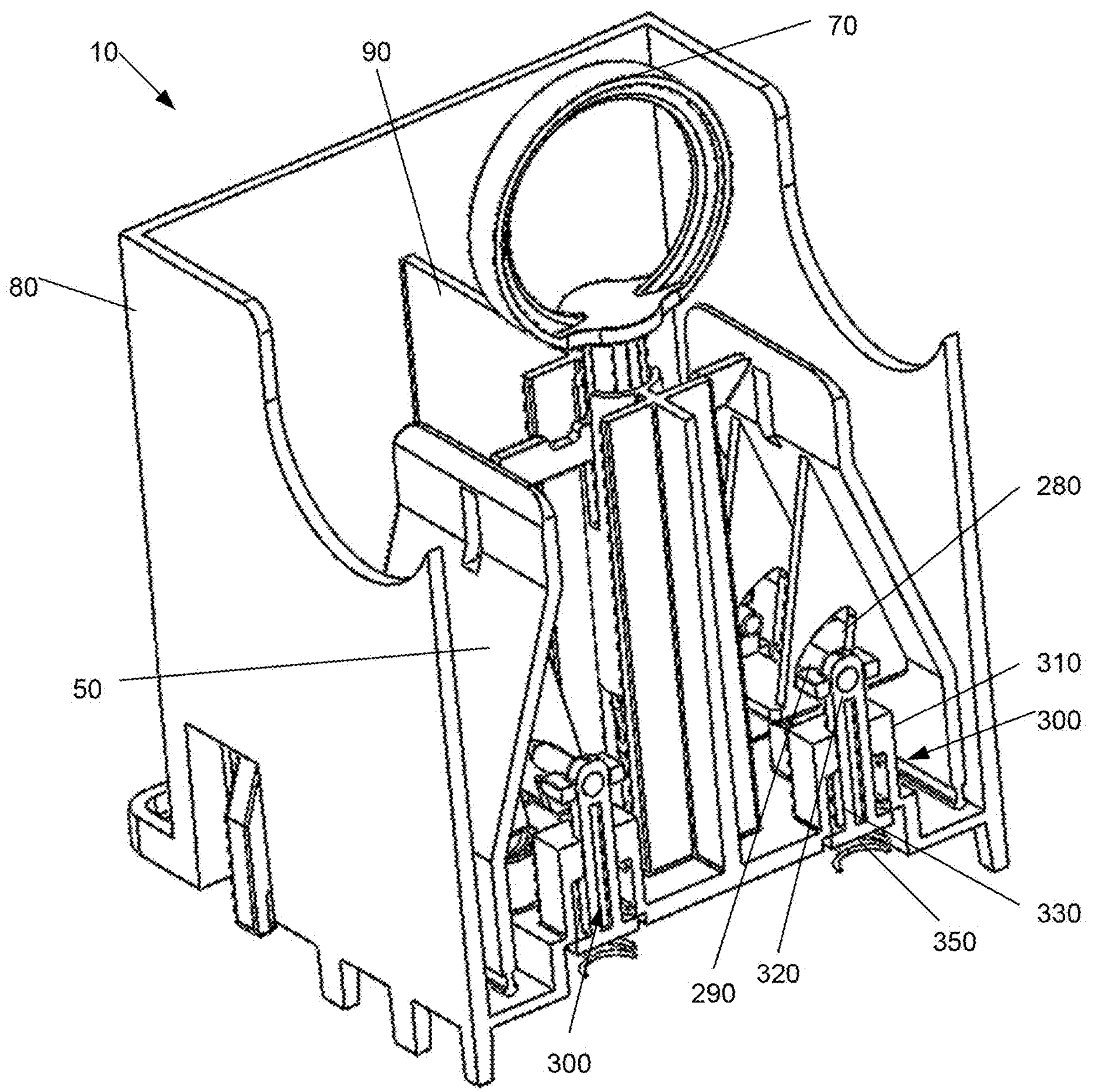
FIG. 8 is a cutaway view of the processor placement tool cut at line BB in FIG. 2.
Figure 9:
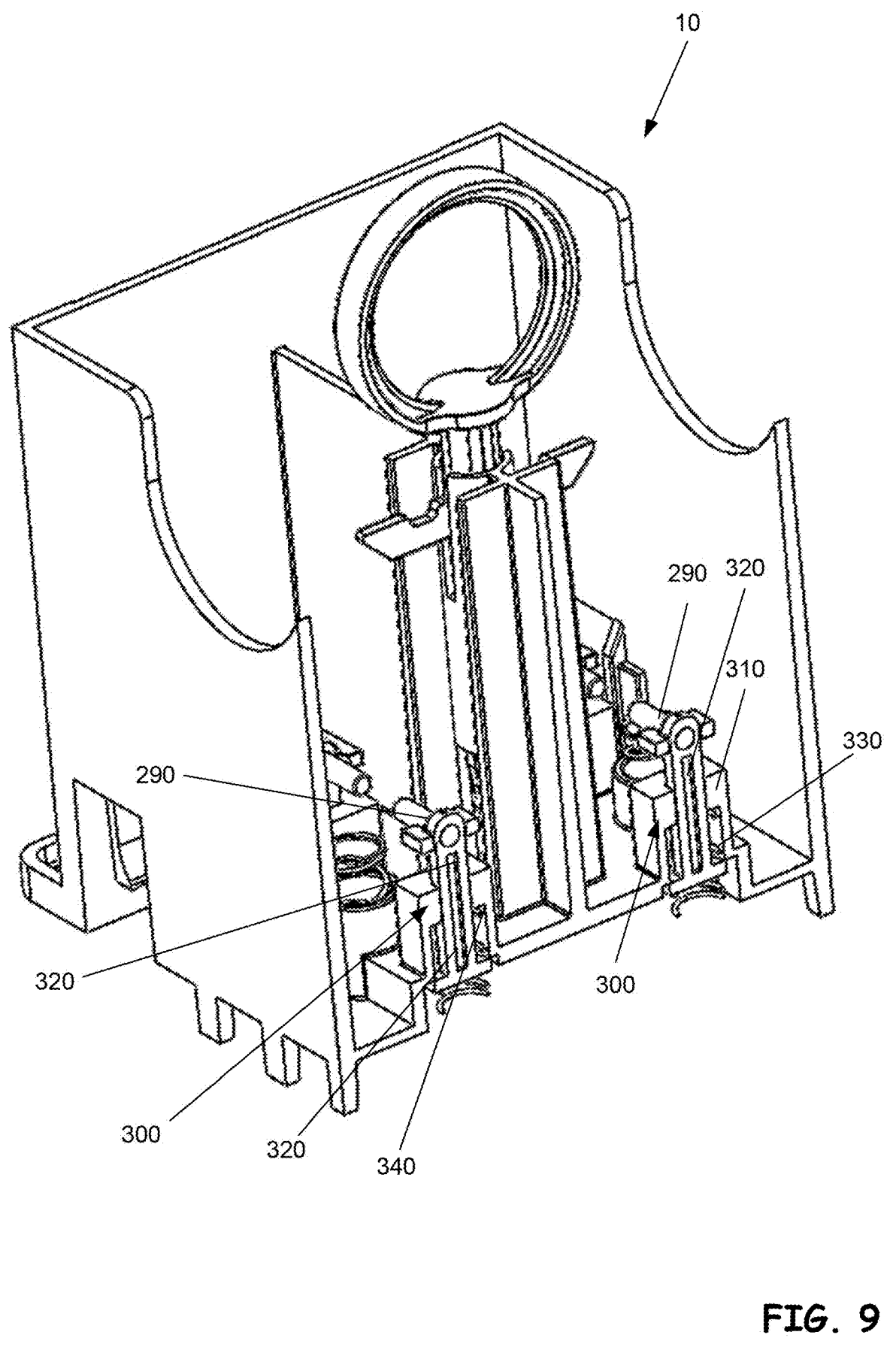

FIG. 1 is a diagrammatic illustration of a processor placement tool (processor tool) according to embodiments of the present disclosure. FIG. 2 is a top down view of the processor placement tool according to embodiments of the present disclosure. FIG. 3 is a cutaway perspective view of the processor placement tool cut at line AA in FIG. 2. FIG. 4 is a cutaway view of the processor placement tool cut at line AA in FIG. 2. FIG. 5 is a front perspective view of a gripping device according to embodiments of the present disclosure. FIG. 6 is a side view of a gripping device according to embodiments of the present disclosure. FIG. 7 is a rear perspective view of a gripping device according to embodiments of the present disclosure. FIG. 8 is a cutaway view of the processor placement tool cut at line BB in FIG. 2. FIG. 9 is a cutaway view of the processor placement tool cut at line BB in FIG. 2 with the gripping devices removed. For purposes of this disclosure, FIGS. 1-9 will be discussed together.

A processor placement tool 10 is provided that allows an operator to place a processor module 20 into position without causing damage to contacts 30 or to the housing of the processor module 20. Further, the processor placement tool 10 is designed to prevent the installation and/or removal of the processor module 20 without the protective cover (not illustrated) in place. The protective cover should be in place anytime the processor module 20 is not protected by a heatsink or a cold plate.

The processor placement tool 10 includes a frame 40, a module gripping device 50 that is supported on the frame 40, guidance features 60, and a handle 70. The frame 40 has an outer frame 80 and an inner frame 90. The outer frame 80 in some embodiments has a box-shape and has sidewalls 100 and a lower surface 110. The lower surface 110 closes a bottom portion of the frame 40. The sidewalls 100 and the lower surface 110 form an open-topped, box-shaped interior in which the inner frame 90, the module gripping device 50, and the handle 70 are located.

The guidance features 60 to the processor placement tool 10 are configured to interface with alignment brackets 120 that are located near where the processor module 20 is located. The guidance features 60 have flanges that extend outwardly from the sidewalls 100 and extensions that extend from a second plane P2 of the lower surface 110. The guidance features 60 can engage with portions of the alignment brackets 120 during the insertion of the processor module 20 to maintain a relative orientation of an array of contacts 30 and the frame 40 during the insertion process. The handle 70 is in communication with the module gripping device 50 and maintains the relative orientation of the array of contacts 30 and the frame 40 during the insertion process onto the corresponding board which runs along plane P1.

The processor placement tool 10 is configured to interact with a processor module 20. The processor module 20 is interposable between the lower surface 110 and the array of contacts 30. The processor module 20 has an upper portion that is designed to be gripped by the module gripping device 50 of the processor placement tool 10 such that the processor module 20 can be lifted, moved and positioned with respect to the alignment brackets 120. The lower portion includes electrical contacts that are respectively connectable with corresponding ones of the array of contacts 30.

The relative orientation of the array of contacts 30 and the frame 40 helps ensure that the second plane P2 of the lower surface 110 is maintained in a parallel condition with respect to the first plane P1. As such, during the insertion process the possibility that the lower surface 110 will place the processor module 20 at an angle or an offset location is decreased. Therefore, as ab angled or offset impacts may lead to damage of the array of contacts 30, the decreased possibility of angled or offset impacts may lead to a decreased incidence of damage.

The inner frame 90 is located within the open-topped, box-shaped interior of the outer frame 80 and is supportive of the module gripping device 50. As such, the inner frame 90 can include a central region 130, lateral regions 140, and hinges 150. The processor placement tool 10 includes two pivotable and spring 330-loaded gripping devices 50. These gripping devices 50 are supported at the lateral regions 140. A first elastic element 170 is anchored in the central region 130 and two additional elastic members are anchored in the lateral regions 140. A spring 330 loaded actuator 190 is placed in the central region 130 as well.

The gripping devices 50 face each other in opposite directions within the open-topped, box-shaped interior of the outer frame 80, and are actuatable to assume at least a module accepting open position and a module engaged closed position. Each gripping device 50 has a corresponding latch 200 element, a wing-shaped body that increases in width with increasing distance from the latch 200 element, a hinge portion 210 that is hinge-coupled to the corresponding lateral region 140. This portion of the gripping device 50 has a hinge-portion flange and a hook portion 230. The hinge-portion flanges are each connected to the corresponding additional elastic elements 180. This allows the gripping devices 50 to be biased to pivot about the hinge-portion flanges toward one another and to bring the module gripping device 50 into the module accepting open position.

The hook portion 230 of the gripping device 50 extends from the hinge portion 210 and through the lower surface 110 and has a distal hook 240 feature. When the module gripping device 50 is in the module engaged closed position, the distal hook 240 grips onto recessions defined in the upper portion of the processor module 20.

The spring 330-loaded actuator 190 can have a tubular element 250 to which the handle 70 is connectable and a hilt 260 portion. The tubular element 250 rides along a shaft 270 in the inner frame 90. The shaft 270 is located in the central region 130 and is connected to the first elastic element 170.

The hilt 260 portion includes two hilt 260*s* that extend radially outwardly from the tubular element 250 to abut with the latch 200 elements when the gripping devices 50 are positioned in the module engaged closed position. That is, the two hilt 260*s* of the hilt 260 portion maintain the gripping devices 50 in the module engaged closed position while acting against the bias applied by the additional elastic elements 180 to the hinge-portion flanges. The first elastic element 170 biases the spring 330-loaded actuator 190 toward a position in which the two hilt 260*s* of the hilt 260 portion abut with the tab latch 200 elements.

However, when the spring 330-loaded actuator 190 is depressed against the bias of the first elastic element 170, the two hilts 260 of the hilt 260 portion slip off of the latch 200 elements. This permits the gripping devices 50 to pivot about the hinge-portions and toward one another and to bring the module gripping device 50 into the module accepting open position. This is due to the bias of additional elastic elements 180. The spring 330-loaded actuator 190 is configured to cause or permit the module gripping device 50 32 to assume the open position from the closed position when the spring 330-loaded actuator 190 is actuated.

The gripping device 50 includes an interlock 280 feature. The interlock 280 feature is designed to prevent the rotation of the gripping device 50 unless a corresponding pin 290 is moved so as to permit the movement of the gripping device 50. The interlock 280 feature is a notch shape having a bottom portion 284 and a top portion 282. The top portion 282 slopes downward to a second bottom portion 286. The second bottom portion 286 then slopes upward to a point where a channel is formed in the interlock 280 feature. A pin 290 or other blocking component can move upward within the channel from the bottom portion 284 to the top portion 282. When the pin 290 is located near the bottom portion 284 rotation is not possible. However, when the pin 290 is at the top portion 282 rotation is possible as the gripping device 50 rotates the pin 290 follows along the sloped top portion 282 permitting the rotation to occur.

The processor placement tool 10 includes four piston interlocks 300 that are located that are located along the lower surface 110 of the processor placement tool 10. However, in some embodiments, there is only one piston interlock for each gripping device 50. The lower surface 110 can be at the same level as lower surface 110 or can be further inset into the body of the processor placement tool 10. Each of the piston interlock 300 location includes a piston housing 310, a piston 320, and a spring 330. The piston 320 is placed within the piston housing 310 such that the piston 320 extends through the top of the piston housing 310. The spring 330 is placed within the piston housing 310 and surrounds the piston 320. The top of the spring 330 interacts with a top portion 282 of the piston housing 310 and the bottom of the spring 330 interacts with the foot 350 of the piston 320. In a neutral position the spring 330 biases the piston 320 foot 350 away from the body of the processor placement tool 10. The top portion 282 of the piston 320 includes a pin 290 that extends from the piston 320 and through the interlock 280 feature of the gripping device 50.

Figure 10A:
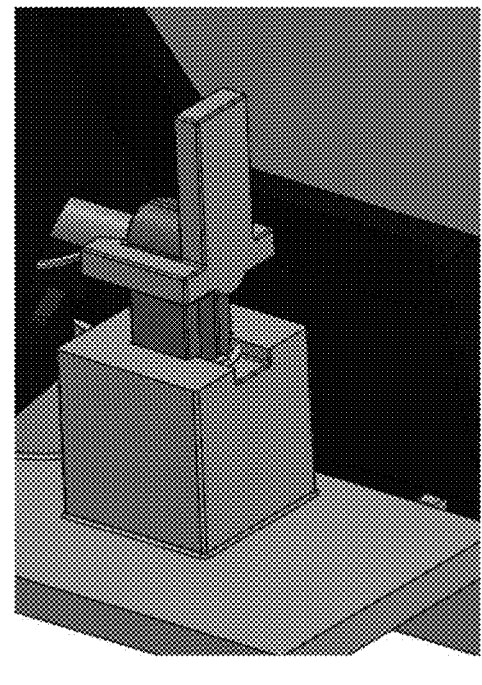
FIGS. 10A-10D are perspective views of various piston interlocks according to embodiments of the present disclosure.
Figure 10B:
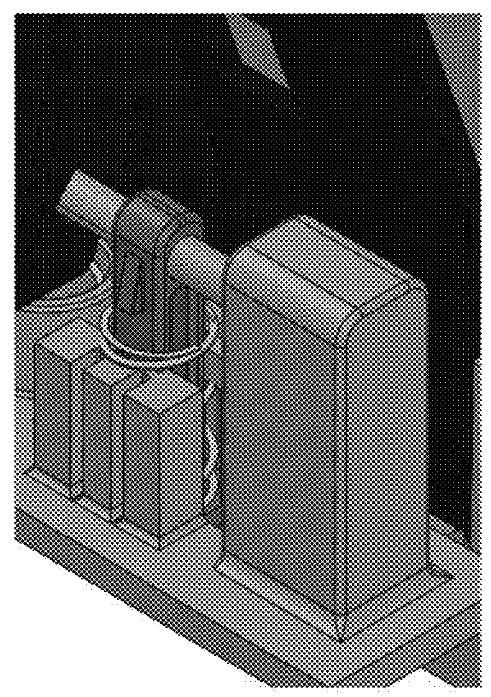
Figure 10C:
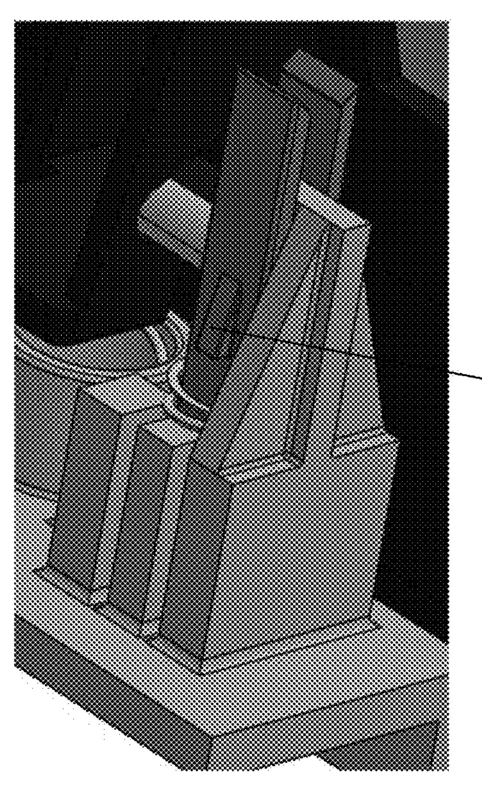
Figure 10D:
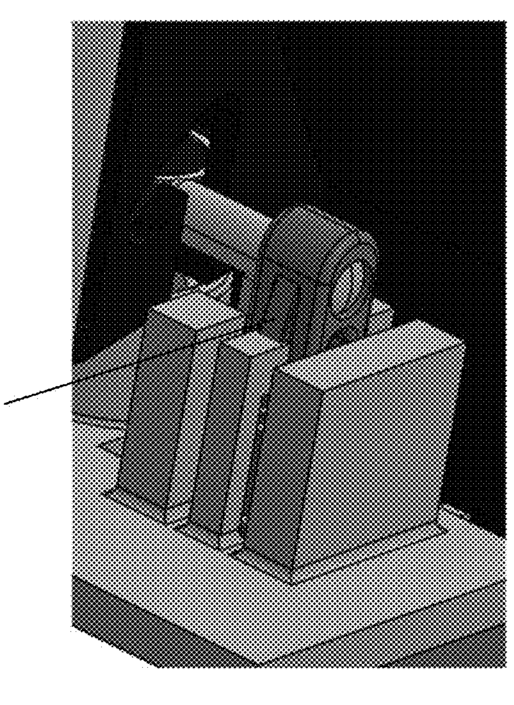

FIGS. 10A-10D illustrate different embodiments of the piston interlocks 300 that can be used to provide the benefits of the present disclosure. FIG. 10A illustrates a piston interlock 300 that uses a snap-in pin 290 to place the pin 290 into the interlock 280. The snap-in pin 290 is snaped onto the piston 320 during the manufacturing or assembly of the tool. FIG. 10B illustrates an extended pin 290 approach to the piston interlock 300. In this embodiment a second housing is provided along the lower surface 110. The pin 290 extends through the piston 320 and interfaces with both the interlock 280 and a track (not illustrated) within the second housing. The piston 320 also includes wing tabs 325 disposed on opposite sides of the piston 320. The wing tabs 325 act to prevent the piston 320 from popping out of the piston housing 310 due to the spring 330 force of the spring 330. However, in some embodiments, the wing tabs 325 are not present and the pin 290 itself acts to prevent the ejection of the piston 320 from the piston housing 310. FIG. 10C illustrates an extended piston 320 approach to the piston interlock 300. In this embodiment a portion of the piston housing 310 extends above the top of the piston housing 310. The piston 320 includes two forks that extend upward from the pin 290. The forks are configured to move against a pin 290 portion of the extended portion. This arrangement can provide additional stability for the piston 320 during movement from unwanted twisting. FIG. 10D illustrates a winged piston 320. The wing piston 320 includes the wing tabs 325 to prevent the ejection of the piston 320 from the piston housing 310. The wing tabs 325 have an advantage in that they don't place the spring 330 pressure on the pin 290 within the interlock 280.

Figures 11A, 11B:
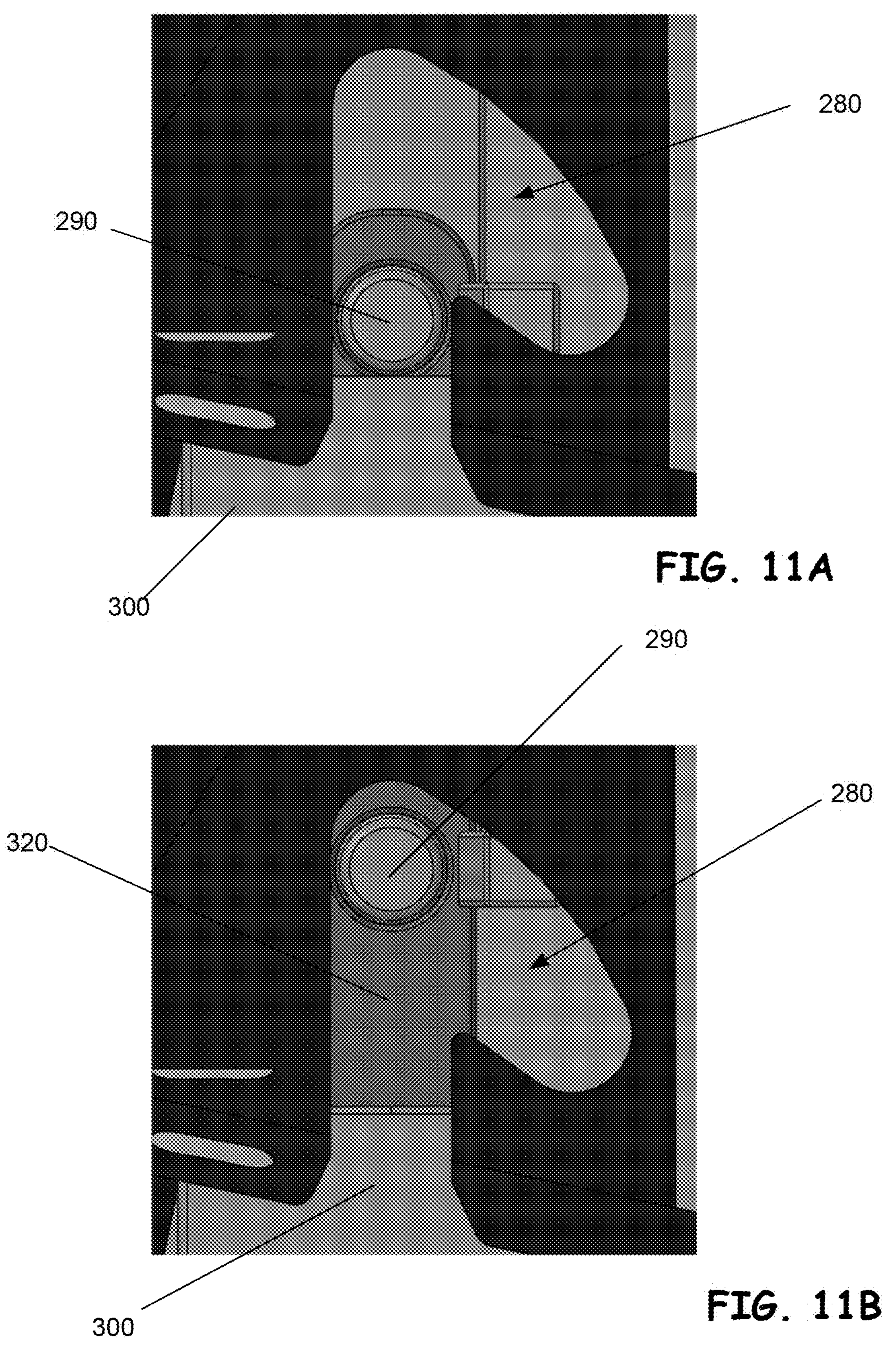
FIG. 11A is a side view of the interlock feature and piston interlock when the piston interlock is in the disengaged position.
FIG. 11B is a side view of the interlock feature and the piston interlock when the piston interlock is the engaged position.

FIG. 11A is a side view of the interlock 280 feature and piston interlock 300 when the piston interlock 300 is in the disengaged position. FIG. 11B is a side view of the interlock 280 feature and the piston interlock 300 when the piston interlock 300 is the engaged position. When the tool is placed over a processor module 20 that includes the processor cover, the feet of the piston 320 contact the top of the processor module 20. As the tool is further engaged, the plungers displace upwards towards the latch 200 portion of the tool. This motion causes the pin 290 to move to a different location within interlock 280 feature. This location in the interlock 280 feature is shaped such that the gripping devices 50 are capable of rotating/hinging in response to the movement of the latch 200. The user is then free to move the gripping elements such that they engage with the processor module 20 as discussed above. When the user lifts the tool, the hook portions 230 of the gripping device 50 are able to pull the processor module 20 up with the tool. Thus, removing the processor module 20.

In contrast, when the tool is placed on a processor module 20 that does not have the protective cover in place, the feet of the piston 320 do not contact any cover or other surface. As a result, the feet do not displace upwards. This keeps pin 290 in the engaged position within the interlock 280 feature. When the user moves the center latch 200, the springs 330 attempt to rotate/hinge the gripping device 50. However, the shape of the interlock 280 prevents the gripping device 50 from being able to rotate. Thus, the gripping device 50 is not able to engage the processor module 20 and allow for the removal/insertion of the unprotected processor module 20. When the user lifts the tool, the processor module 20 does not move with it.

During an operation of the processor placement tool 10 when the protective cover is in place and the pistons have moved to permit the interlock 280 to be released, an operator begins insertion process by maneuvering the frame 40 over the processor module 20 and depresses the actuator 190 to bring the module gripping device 50 into the module accepting open position. At this point, the operator causes the distal hook 240 features of the hook portions 230 to grip onto the upper portion of the processor module 20 such that the processor module 20 is held by the processor placement tool 10. The operator then lifts the processor placement tool 10 (and the processor module 20) by inserting their finger into the ring element and positions the processor placement tool 10 over the alignment brackets 120. Simultaneously, the frame 40 and the processor placement tool 10 pivot about the contact surface in a self-centering action (with the at least one degree of freedom) to achieve a parallel orientation. The operator lowers the frame 40 toward the alignment brackets 120 while maintaining a parallel arrangement. Once in place the processor module 20 can be further manipulated to complete the installation process.

In summary the present disclosure is directed to a processor placement tool that prevents removal of the processor module unless the protective cover is in place. The processor placement tool includes a first gripping device and a second gripping device. The first and second gripping devices are parallel to each other and can move between a module open position and a module closed position. The first and second gripping devices further include an interlock portion. The processor placement tool includes a first elastic element that is configured to bias an actuator. Additional elastic elements are provided to interact with the first and second gripping devices. The additional elastic elements are configured to cause the first and second gripping devices to assume the module open position in the absence of an applied force on them. The actuator including a handle, a tubular element, and hilts that extend outwardly from the tubular element. The hilts are designed to hold the first and second gripping devices in the module closed position against a bias applied to the first and second gripping devices by the additional elastic elements. The first elastic element causes the hilts to release the first and second gripping devices from the module closed position to the module open position. The processor placement tool also includes at least two piston interlocks placed such that at least one piston interlock interfaces with the interlock portion of each of the first and second gripping devices. The piston interlocks prevent movement of the first and second gripping devices from the module open position to the module closed position in the absence of a protective cover on a processor module. The piston interlock is made up of a piston housing, a piston, a pin, and a spring. The piston is disposed within the piston housing and has a foot portion the bottom of the piston. The pin is attached to the piston and extends outward from the piston and through the interlock portion. The spring is located around the piston such that the bottom portion of the spring contacts the foot of the piston, and the top portion of the spring contacts the piston housing. The springs holds the piston in a blocking position until the foot of the piston is displaced in response to contact with the protective cover of the processor module.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor placement tool comprising:

a first gripping device and a second gripping device, the first and second gripping devices disposed parallel to each other and actuatable between a module open position and a module closed position, the first and second gripping devices further include an interlock portion;

a first elastic element;

additional elastic elements in communication with the first and second gripping devices, configured to cause the first and second gripping devices to assume the module open position in the absence of an applied force on the additional elastic elements;

an actuator including a handle, a tubular element, and hilts extending outwardly from the tubular element, the hilts configured to hold the first and second gripping devices in the module closed position against a bias applied to the first and second gripping devices by the additional elastic elements, and configured to cause the hilts to release the first and second gripping devices from the module closed position to the module open position in response to bias from the first elastic element; and at least two piston interlocks disposed in the processor placement tool such that at least one piston interlock interfaces with the interlock portion of each of the first and second gripping devices and configured to prevent movement of the first and second gripping devices from the module open position to the module closed position in the absence of a protective cover on a processor module, each piston interlock comprising;

a piston housing;

a piston disposed within the piston housing, the piston having a foot portion disposed on a bottom of the piston, and configured to move within the piston housing;

a pin attached to the piston, the pin extending outward from the piston and through the interlock portion; and a spring disposed around the piston wherein a bottom portion of the spring contacts the foot of the piston and a top portion of the spring contacts the piston housing, the springs configured to hold the piston in a blocking position until the foot of the piston displaces the piston in response to contact with the protective cover of the processor module.

2. The processor placement tool of claim 1 wherein the first and second gripping devices include a second interlock portion wherein the second interlock portion has a corresponding piston interlock interfacing with the second interlock portion.

3. The processor placement tool of claim 1 wherein the piston interlocks includes a snap-in pin.

4. The processor placement tool of claim 1 wherein the position interlocks include an extended pin.

5. The processor placement tool of claim 1 wherein the piston is an extended piston, wherein the extended piston extends above the pin.

6. The processor placement tool of claim 1 wherein the piston is a winged piston, wherein the piston includes wing tabs configured to prevent ejection of the piston from the piston housing.

7. A method for preventing a processor placement tool from placing a processor module without a protective cover in place, the method comprising:

placing the processor placement tool over the processor module, wherein the processor placement tool comprises;

a first gripping device and a second gripping device, the first and second gripping devices disposed parallel to each other and actuatable between a module open position and a module closed position, the first and second gripping devices further include an interlock portion;

a first elastic element;

additional elastic elements in communication with the first and second gripping devices, configured to cause the first and second gripping devices to assume the module open position in the absence of an applied force on the additional elastic elements;

an actuator including a handle, a tubular element, and hilts extending outwardly from the tubular element, the hilts configured to hold the first and second gripping devices in the module closed position against a bias applied to the first and second gripping devices by the additional elastic elements, and configured to cause the hilts to release the first and second gripping devices from the module closed position to the module open position in response to a bias from the first elastic element; and at least two piston interlocks disposed in the processor placement tool such that at least one piston interlock interfaces with the interlock portion of each of the first and second gripping devices and configured to prevent movement of the first and second gripping devices from the module open position to the module closed position in the absence of a protective cover on a processor module, each piston interlock comprising;

a piston housing;

a piston disposed within the piston housing, the piston having a foot portion disposed on a bottom of the piston, and configured to move within the piston housing;

a pin attached to the piston, the pin extending outward from the piston and through the interlock portion; and a spring disposed around the piston wherein a bottom portion of the spring contacts the foot of the piston and a top portion of the spring contacts the piston housing, the springs configured to hold the piston in a blocking position until the foot of the piston displaces the piston in response to contact with the protective cover of the processor module;

applying a lifting force to the processor placement tool; and preventing by the interlocks and the piston interlocks movement of the first and second gripping devices to the module closed position.

8. The method of claim 7 wherein when the protective cover is over the processor module, the method further comprising:

prior to applying the lifting force to the processor placement tool;

contacting by the piston foot the protective cover;

displacing the pin in response to the contacting, such that pin moves within the interlock from an engaged position to a disengaged position such that rotation of the first and second gripping devices is possible; and rotating the first and second gripping devices to the module closed position in response to the applied lifting force.

* * * * *